(12) United States Patent
Song

(10) Patent No.: US 6,410,944 B1
(45) Date of Patent: Jun. 25, 2002

(54) EPITAXIAL STRUCTURE FOR LOW OHMIC CONTACT RESISTANCE IN P-TYPE GAN-BASED SEMICONDUCTORS

(75) Inventor: Jong In Song, Kwangju (KR)

(73) Assignee: Kwangju Institute of Science and Technology (KR)

( * ) Notice: Subject to any disclaimer, the term of this patent is extended or adjusted under 35 U.S.C. 154(b) by 0 days.

(21) Appl. No.: 09/394,223

(22) Filed: Sep. 13, 1999

(30) Foreign Application Priority Data

Mar. 17, 1999 (KR) .............................................. 99-9063

(51) Int. Cl.$^7$ .............................................. H01L 33/00

(52) U.S. Cl. ...................... 257/99; 257/103; 257/744; 257/745

(58) Field of Search .................. 257/99, 744, 745, 257/103

(56) References Cited

U.S. PATENT DOCUMENTS

| | | | | |
|---|---|---|---|---|
| 5,804,834 A | * | 9/1998 | Shimoyama et al. | 257/99 |
| 6,046,464 A | * | 4/2000 | Schetzina | 257/96 |
| 6,238,945 B1 | * | 5/2001 | Kaneko | 438/46 |

* cited by examiner

*Primary Examiner*—Minh Loan Tran
(74) *Attorney, Agent, or Firm*—Oppenheimer, Wolff & Donnelly, LLP

(57) ABSTRACT

Disclosed are an epitaxial structure for low ohmic contact resistance in p-type GaN-based semiconductors and a method for growing such a structure. A very high density of p-type doped GaAs or p-type graded $Al_xGa_{1-x}As$ ($0<x\leq1$) is formed between an ohmic metal and a p-type GaN and subjected to crystal growth. The doped p-type GaAs or graded p-type $Al_xGa_{1-x}As$ reduces the potential barrier formed in the p-type GaN, thus significantly reducing the ohmic resistance. This structure can be applied for the improvement in the power efficiency and function of GaN-based optical devices and ultra-speed electronic devices.

5 Claims, 5 Drawing Sheets

| | | |
|---|---|---|
| 2 — | Ohmic metal : Ti/Pt/Au Or Ni/Pt/Au etc | |
| 6 — | p$^{++}$-type GaAs ▲ Al$_x$ Ga$_{1-x}$ As (0 ≤ x ≤ 1) | p~2x10$^{20}$/cm$^3$ |
| 1 — | p-type GaN | p~10$^{18}$/cm$^3$ |
| 3 — | n-type GaN | n~10$^{18}$/cm$^3$ |
| 4 — | Buffer | No impyrity doped |
| 5 — | Substrate | |

EPITAXIAL STRUCTURE FOR LOW OHMIC CONTACT RESISTANCE IN P-TYPE GAN-BASED SEMICONDUCTORS

BACKGROUND OF THE INVENTION

1. Field of the Invention

The present invention relates to an epitaxial (hereinafter referred to as "Epi") structure for low ohmic contact resistance and a method for growing such a structure.

2. Description of the Prior Art

In recent, GaN-based semiconductor devices have been put into the spotlight all over the world. GaN-based semiconductors are characteristic of large energy band gaps (Eg=3.4 eV) in comparison with conventional group III–V compound semiconductors. Numerous applications exist in the optical devices and electronic devices which stand in need of such characteristics.

The GaN-based optical devices are exemplified by light emitting diodes and laser diodes, which emit blue light, found in the short wavelength side of the visible light spectrum, and are applied for displays which require the three primary colors and high density information storage devices such as CD pickup, etc.

Applications of the GaN-based electronic devices can be found in field effect transistors (FET) and hetrojunction bipolar transistors (HBT), which take advantage of the high speed operation possibility due to excellent electron mobility and the high temperature and high power operation possibility due to large energy band gaps. To date, active research has been directed to the development of the GaN-based electronic devices which require high temperature and high power operation.

Generally, preparing techniques of GaN-based optical or electronic devices find difficulty in forming low p-type ohmic resistance owing to the following three reasons:

First, the band gap of GaN as large as 3.4 eV induces a large potential barrier ($\Phi b1$) when the metal used for ohmic formation is brought into contact with p-type GaN, resulting in the formation of a very large ohmic resistance (the current flowing through an ohmic contact is proportional to an exponential function of the potential barrier, exp (–$\Phi b$).

Next, the potential barrier ($\Phi b1$) which Ni, a most typically used p-type ohmic metal of GaN, forms along with GaN, is very large, identified as amounting to two thirds (about 2.25 eV) of the band gap of GaN, as shown in FIG. 4c.

Finally, the p-type impurity density of GaN is generally smaller than the n-type impurity density and the tunneling effective mass of holes is larger than that of electrons, so a relatively large resistance is formed at p-type GaN upon ohmic contact.

In association with such a large resistance, there occur problems in the preparing techniques of GaN-based optical or electronic devices.

First, optical devices, as shown in FIG. 4d, demand higher voltages to generate the same amounts of an optical signal (proportional to current). This leads to decreasing the luminescence efficiency of optical devices and increasing their power consumption. Further, the large amount of heat generated owing to large ohmic resistance may decrease the reliability of optical devices.

In the case of the electronic devices using p-type ohmic electrodes, such as HBT, large ohmic resistance acts decisively to deteriorate their velocity characters.

With reference to FIG. 4, there is illustrated a conventional technique of forming an ohmic electrode of a p-type GaN-based semiconductor. As shown in FIG. 4a, a conventional Epi structure has an ohmic metal 2, such as nickel, deposited on a p-type GaN 1 atop an n-type GaN 3 which is formed above a substrate 1 with a buffer 2 being interposed therebetween. The ohmic metal 2 is subjected to thermal treatment to increase the p-type impurity density of GaN at the ohmic contact surface. In FIGS. 4b and 4c, reference letter Eg denotes an energy band gap in which no free electron ⓔ- and hole ⓗ-allowable energy levels exist. Reference letters $E_{FM}$ and $E_{SM}$ stand for Fermi levels and $V_{ON}$ and $I_{ON}$ denote the turn on voltage and current of diodes, respectively.

The increasing of the p-type impurity density of GaN brings about reducing the width of the potential barrier which takes place in the ohmic contact, thereby increasing the tunneling current component to effect the attenuation of ohmic resistance. However, since the height of the potential barrier is not greatly affected, as low p-type ohmic resistance as desired is rarely achieved.

SUMMARY OF THE INVENTION

In conventional techniques, the density of p-type GaN at ohmic contacts is increased through thermal treatment, so as to reduce the width of the potential barrier formed. The reduction in the width of the potential barrier increases the tunneling probability of holes through the potential barrier, resulting in an increase in the current which flows through the ohmic resistance (that is, the resistance is reduced). However, the reduction effect of resistance is limited owing to the fact that the height of the potential barrier is not affected so that the flow of a number of holes is still blocked by the high potential barrier.

Therefore, the present invention has a technical object of lowering the potential barrier occurring in a p-type GaN to significantly reduce the ohmic resistance thereof, allowing the provision of high performance GaN-based optical devices or electronic devices.

In an aspect of the present invention, there is provided an Epi structure for low ohmic contact resistance in p-type GaN-based semiconductors, comprising a p-type GaAs which is doped at a very high density between an ohmic contact metal and a p-type GaN and subjected to crystal growth, wherein a potential barrier formed in the p-type GaN can be reduced upon the formation of ohmic contact on the p-type GaN.

In another aspect of the present invention, there is provided an Epi structure for low ohmic contact resistance in p-type GaN-based semiconductors, comprising a p-type $Al_xGa_{1-x}As$ ($0<x\leq1$) which is doped at a very high density and graded between an ohmic contact metal and a p-type GaN and subjected to crystal growth, wherein a potential barrier formed in the p-type GaN can be reduced upon the formation of ohmic contact on the p-type GaN.

In accordance with the present invention, the Epi structure is characterized in that the ohmic contact metal is a non-alloyed ohmic contact metal.

In accordance with the present invention, the Epi structure is characterized in that the ohmic contact metal is an alloyed ohmic contact metal and thermally treated to increase the p-type impurity density of the p-type GaN, wherein the width of the potential barrier formed between the doped GaAs or graded $Al_xGa_{1-x}As$ ($0<x\leq1$) and the p-type GaN can be reduced.

In a further aspect of the present invention, there is provided a method for growing an Epi structure for low ohmic resistance in p-type GaN-based semiconductors, comprising the steps of: depositing a p-type GaAs at a very high density onto a p-type GaN; forming a non-alloyed ohmic metal layer over the p-type GaAs; and subjecting the p-type GaAs to crystal growth, whereby a potential barrier formed in the p-type GaN can be reduced upon the formation of ohmic contact on the p-type GaN.

In still a further aspect of the present invention, there is provided a method for growing an epitaxial structure for low ohmic resistance in p-type GaN-based semiconductors, comprising the steps of: depositing a p-type $Al_xGa_{1-x}As$ (0<x≦1) at a very high density onto a p-type GaN; forming an alloyed ohmic metal layer over the p-type GaAs; thermally treating the ohmic metal layer; and subjecting the p-type $Al_xGa_{1-x}As$ to crystal growth.

BRIEF DESCRIPTION OF THE DRAWINGS

The above and other objects, features and other advantages of the present invention will be more clearly understood from the following detailed description taken in conjunction with the accompanying drawings, in which:

FIG. 1b is an energy band block diagram of the Epi structure of FIG. 1a;

FIG. 4b is an energy band block diagram of the Epi structure of FIG. 4a;

DETAILED DESCRIPTION OF THE INVENTION

Figure 1A:
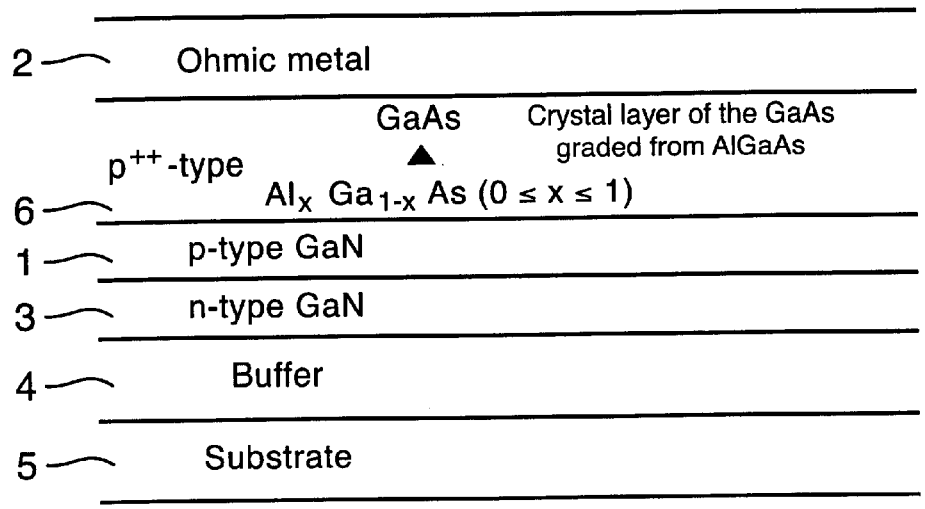
FIG. 1a is a schematic cross sectional illustration of an Epi structure for low ohmic contact resistance in p-type GaN-based semiconductors, in accordance with the present invention.
Figure 1B:
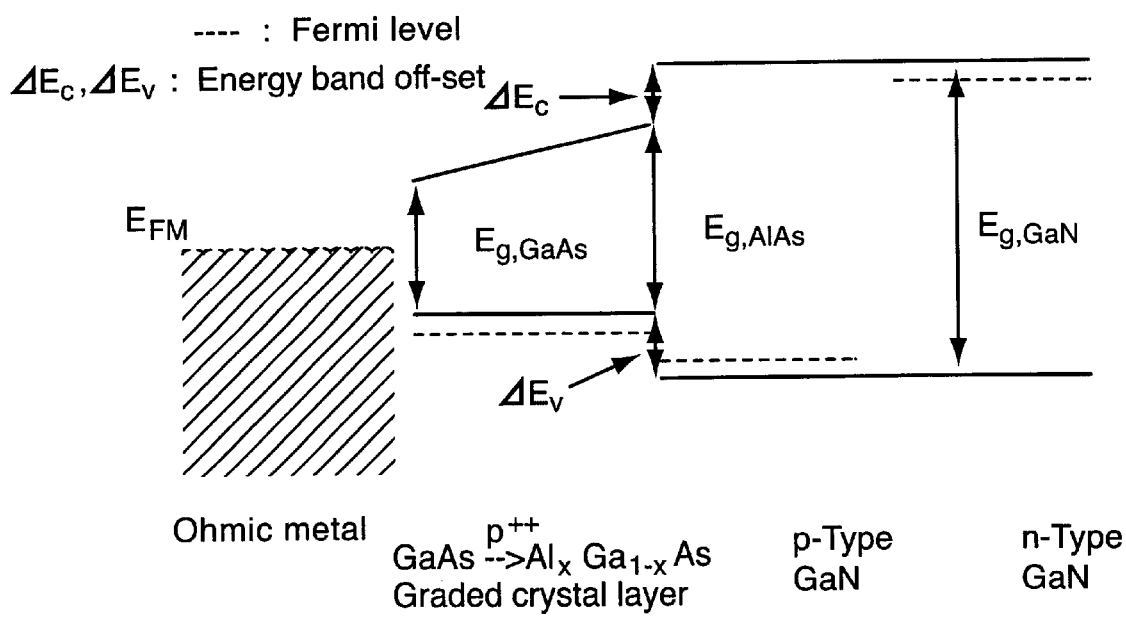

Below, details are given of the present invention in conjunction with the accompanying drawings, wherein like reference numerals are used for like and corresponding parts, respectively.

EXAMPLE 1

Figures 1C, 2:
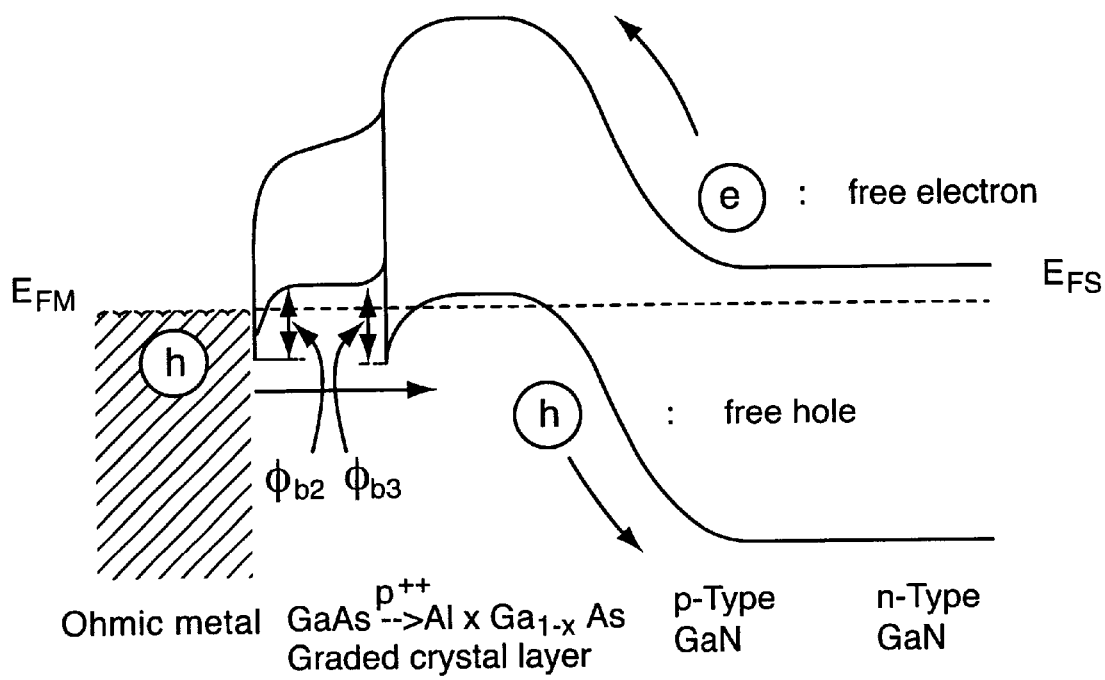
FIG. 1c is an energy band block diagram of the Epi structure of FIG. 1a, viewed from an equilibrium state.
FIG. 2 is a schematic cross sectional illustration of an Epi structure applied for GaN-based optical devices.
Figure 3:
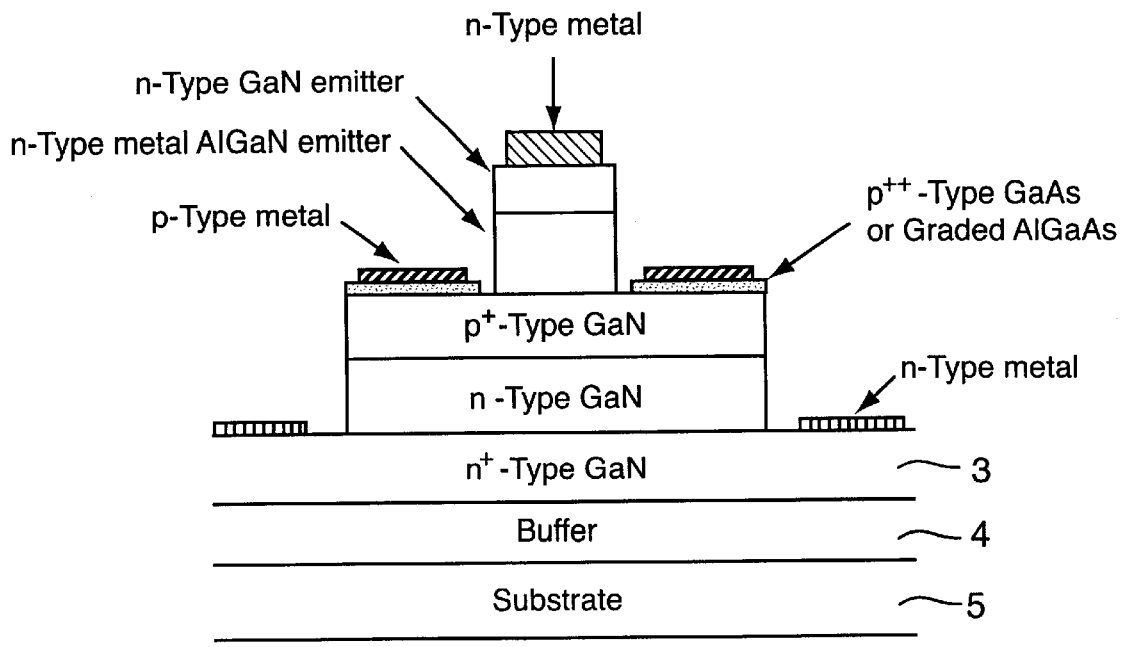
FIG. 3 is a schematic cross sectional illustration of an Epi structure applied for GaN-based HBT devices.
Figure 4A:
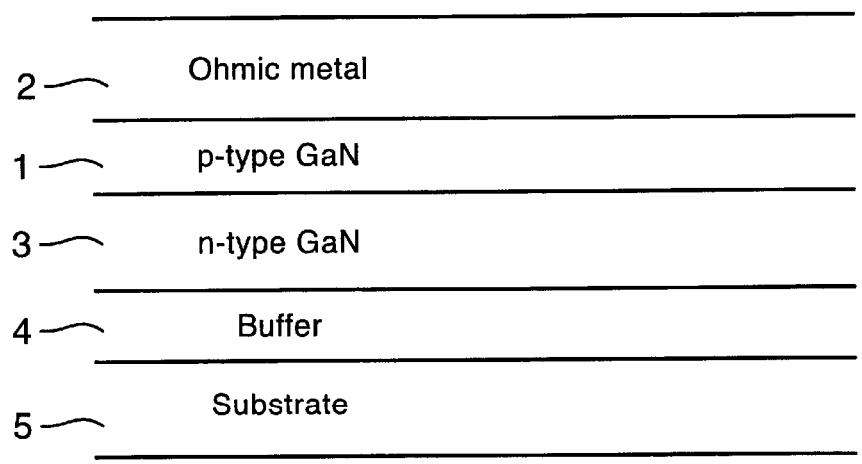
FIG. 4a is a schematic cross sectional illustration of a conventional Epi structure for low ohmic contact resistance in p-type GaN-based semiconductors.
Figure 4B:
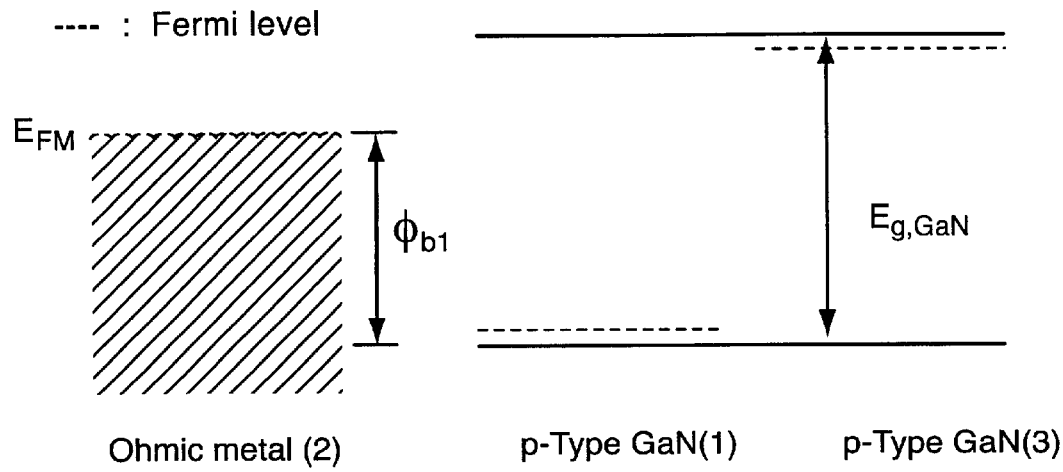
Figure 4C:
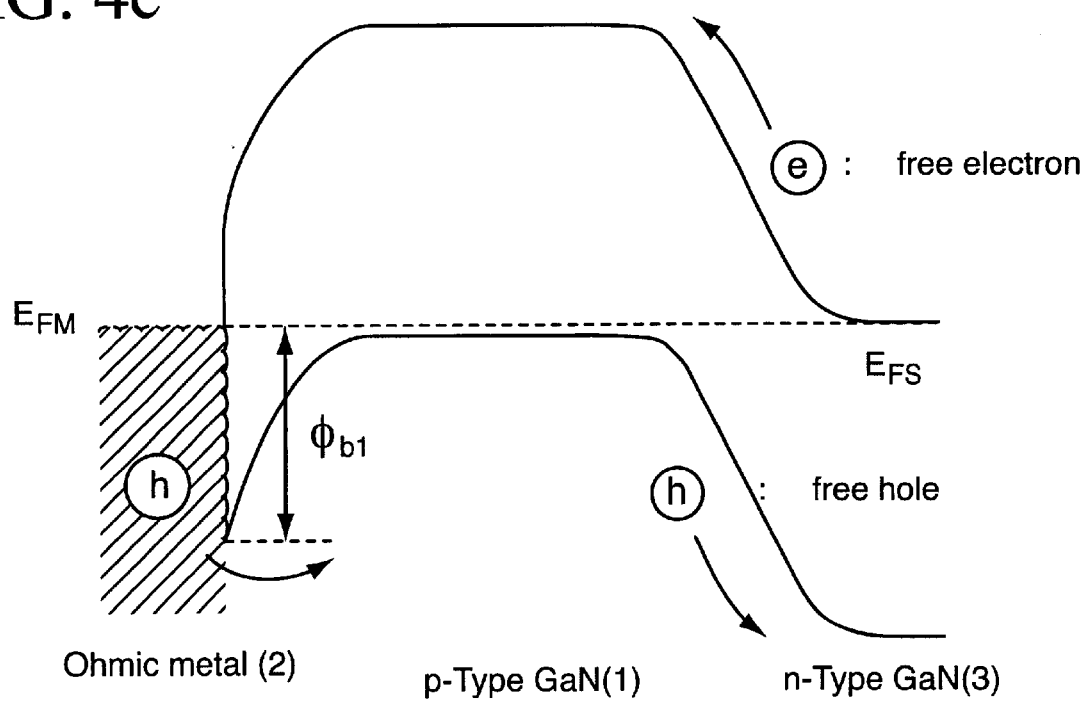
FIG. 4c is an energy band block diagram of the Epi structure of FIG. 4a, viewed from an equilibrium state.
Figure 4D:
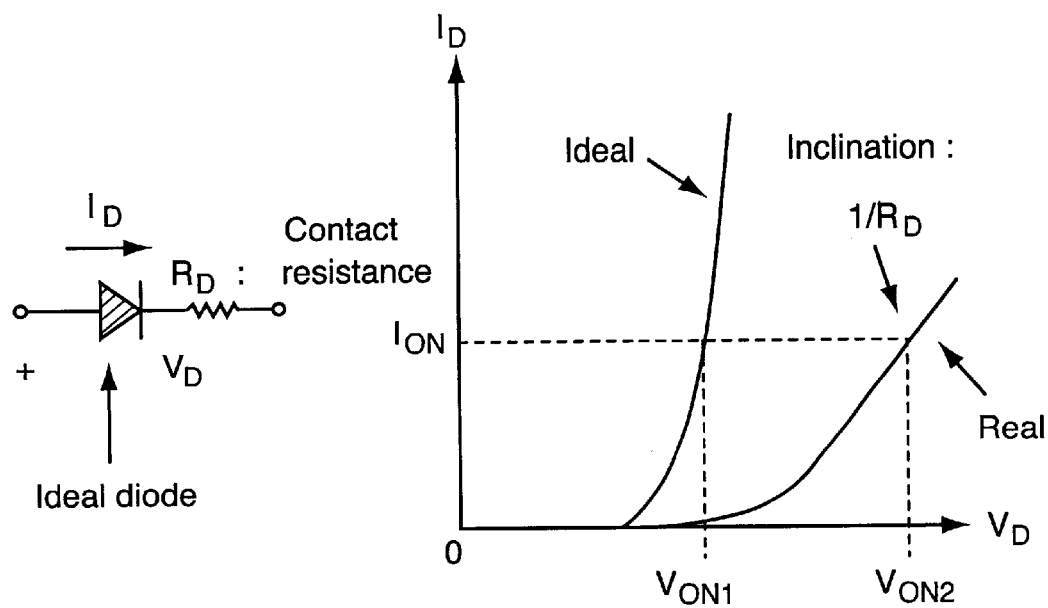
FIG. 4d shows an equivalent circuit diagram and its ampere-voltage curve of an ideal GaN-based p-n junction, compared with a conventional one.

With reference to FIG. 1a, there is shown an Epi structure according to the present invention. As seen in this figure, a p-type GaAs 6 is doped at a very high density and undergoes crystal growth on a p-type GaN 1. FIG. 1c shows a potential barrier of this structure. When x is zero in $Al_xGa_{1-x}As$, the potential barrier (Φb2) formed in the structure is determined to be as low as 0.72 eV which is about half of the band gap (1.43 eV) of GaAs.

With respect to GaAs, most metals are known to form a potential barrier amounting to half of the band gap by virtue of the Fermi level pinning.

In addition, the p-type GaAs makes the width of the potential barrier very narrow, so that the tunneling probability of the holes is very high. Further, a negligibly small ohmic resistance is formed between the ohmic metal 2 and the p-type GaAs 6. At this time, between the GaAs and the GaN is formed a potential barrier (Φb3) as low as about 1.9 eV which is smaller by 0.35 eV than the potential barrier (Φb1) of the conventional technique. Therefore, the very high density of the doped p-type GaAs gives a great contribution to reduction of the ohmic resistance. The thickness of the p-type GaAs is related to the doping density of the p-type. For example, if the doping density of the p-type is $2\times10^{20}/cm^3$, GaAs as thin as 60 Å is sufficient for this purpose. Such a very high density of p-type impurities of GaAs can be achieved by doping carbon, beryllium or zinc upon crystal growth. Particularly, beryllium is known to allow the impurity concentration to be easily obtained at $2\times10^{20}/cm^3$ or more.

In the above structure, even the non-alloyed ohmic contact metals which do not require high temperature thermal treatment, such as Ti/Pt/Au, can bring about sufficiently small ohmic resistance.

If conventional alloyed ohmic contact metals which require high temperature thermal treatment, such as Ni/Pt/Au, are used, however, even lower ohmic resistance can be obtained. The reason is that the nickel diffused by thermal treatment plays a role in increasing the p-type impurity concentration of GaN, thereby reducing the width of the potential barrier between the GaAs and the GaN.

Almost the same thermal conditions as in the conventional techniques can be employed because the thickness of the GaAs layer grown is so thin that the diffusion of nickel cannot be affected.

EXAMPLES II

In order to further improve the effect of Example I, as shown in FIG. 1a, there is grown a crystal layer 6 of the GaAs graded from a very high density of the p-type $Al_xGa_{1-x}As$ (o<x≦1) doped on the p-type GaN. In this case, a negligibly small ohmic resistance is formed between the ohmic metal 2 and the p-type GaAs so that the potential barrier (Φb2) is formed at about 0.72 eV which is nothing but a half of the band gap (1.43 eV) of the GaAs, as shown in FIG. 1c. When x is 0.45 or less in $Al_xGa_{1-x}As$, the potential barrier between the $Al_xGa_{1-x}As$ and the GaN satisfies the equation of 3=1.906−0.526x. On the other hand, when x ranges from 0.45 to 1 in $Al_xGa_{1-x}As$, the potential barrier between the $Al_xGa_{1-x}As$ and the GaN satisfies the equation of $\Phi b3=1.704+0.015x-0.143x^2$. The potential barriers obtained from the equations are smaller than 1.9eV, obtained in Example I, so the ohmic resistance can be further reduced. Where x=1, that is, where AlAs is used, Φb3 comes to have about 1.57 eV which is smaller by 0.68 eV and 0.33 eV than 2.25 eV, obtained in the conventional technique, and 1.9 eV, obtained in Example I, respectively. As in GaAs, about 60 Å is suitable for the thickness of the graded $Al_xGa_{1-x}AS$ layer if the p-type doping density is $2\times10^{20}/cm^3$. This high concentration of the p-type impurity can be obtained by using carbon, beryllium or zinc upon crystal growth.

Available ohmic contact metals in Example II can be found in the GaAs crystal growth of Example I.

As in the above, the present invention can be applied for the improvement in the power efficiency and function of GaN-based optical devices and GaN-based HBT devices.

As described hereinbefore, the power efficiency of the p-type ohmic contact resistance of GaN optical devices such as LED and LD is much improved by reducing the p-type ohmic contact resistance of GaN, in accordance with the present invention. The GaN optical devices fabricated according to the present invention can be operated at low voltages through the reduction of the contact resistance ($R_D$), compared with those fabricated according to conventional techniques. Moreover, such contact resistance reduction leads to a reduction of the power consumed thereat, resulting in a decrease in the operation temperature of the devices and an extension in the life span of the devices.

In addition, the small p-type ohmic contact resistance of GaN, achieved in the present invention, can give a great contribution to an improvement in the function of GaN-based HBT devices, which are ultra-speed electronic devices. The p-type ohmic contact resistance according to the present invention serves as a base resistance of Npn HBT and thus, the reduction of the base resistance can induce an increase in power gain and operation speed and a decrease in super-high frequency noise.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. An epitaxial structure for low ohmic contact resistance in p-type GaN-based semiconductors, comprising a p-type GaAs which is doped at a very high density between an ohmic contact metal and a p-type GaN and subjected to crystal growth, wherein a potential barrier formed in the p-type GaN is reduced and a low ohmic contact resistance is formed between the ohmic contact metal and the p-type GaAs.

2. An epitaxial structure for low ohmic contact resistance in p-type GaN-based semiconductors, comprising a p-type $Al_xGa_{1-x}As$ ($0<x\leq1$) which is doped at a very high density and graded between an ohmic contact metal and a p-type GaN and subjected to crystal growth, wherein a potential barrier formed in the p-type GaN is reduced and a low ohmic contact resistance is formed between the ohmic contact metal and the p-type $Al_xGa_{1-x}As$ ($0<x\leq1$).

3. An epitaxial structure as set forth in claim 1 or 2, wherein said ohmic contact metal is a non-alloyed ohmic contact metal.

4. An epitaxial structure as set forth in claim 1, wherein the ohmic contact metal is an alloyed contact metal and is thermally treated to increase the p-type impurity density of the p-type GaN, wherein the width of the potential barrier formed between the doped GaAs and the p-type GaN is further reduced.

5. An epitaxial structure as set forth in claim 2, wherein the ohmic contact metal is an alloyed contact metal and is thermally treated to increase the p-type impurity density of the p-type GaN, wherein the width of the potential barrier formed between the graded $Al_xGa_{1-x}As$ ($0<x\leq1$) and the p-type GaN is further reduced.

* * * * *